(12) United States Patent
Shang et al.

(10) Patent No.: US 12,374,389 B2
(45) Date of Patent: Jul. 29, 2025

(54) MEMORY BANK AND MEMORY

(71) Applicant: CHANGXIN MEMORY TECHNOLOGIES, INC., Hefei (CN)

(72) Inventors: Weibing Shang, Hefei (CN); Hongwen Li, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 168 days.

(21) Appl. No.: 18/154,292

(22) Filed: Jan. 13, 2023

(65) Prior Publication Data

US 2023/0206994 A1 Jun. 29, 2023

Related U.S. Application Data

(63) Continuation of application No. PCT/CN2022/109220, filed on Jul. 29, 2022.

(30) Foreign Application Priority Data

Dec. 23, 2021 (CN) .......................... 202111590252.0

(51) Int. Cl.
*G11C 11/4097* (2006.01)
*G11C 11/408* (2006.01)
(Continued)

(52) U.S. Cl.
CPC ...... *G11C 11/4097* (2013.01); *G11C 11/4087* (2013.01); *G11C 11/4091* (2013.01); *G11C 11/4096* (2013.01); *G11C 2211/4062* (2013.01)

(58) Field of Classification Search
CPC ............ G11C 11/4097; G11C 11/4087; G11C 11/4091; G11C 11/4096; G11C 2211/4062
(Continued)

(56) References Cited

U.S. PATENT DOCUMENTS 6,229,726 B1 5/2001 Wang et al.
7,032,142 B2 4/2006 Fujioka et al.
(Continued)

FOREIGN PATENT DOCUMENTS

CN 1421871 A 6/2003
CN 105261391 A 1/2016
(Continued)

OTHER PUBLICATIONS

International Search Report cited in PCT/CN2022/109220 mailed Oct. 26, 2022, 9 pages.
(Continued)

*Primary Examiner* — Amir Zarabian
*Assistant Examiner* — Daniel J King
(74) *Attorney, Agent, or Firm* — Syncoda LLC; Feng Ma

(57) ABSTRACT

The present disclosure provides a memory bank and a memory. The memory bank includes: multiple memory arrays arranged along a first direction, each of the memory arrays being divided into at least two array units along a second direction, and the first direction and the second direction being perpendicular to each other; multiple read-write control circuits, the read-write control circuits being provided between adjacent two of the memory arrays; and multiple data signal lines configured to electrically connect the read-write control circuits and the array units; wherein, different array units of each of the memory arrays are electrically connected to different read-write control circuits through different data signal lines.

12 Claims, 8 Drawing Sheets

(51) Int. Cl.
  *G11C 11/4091*  (2006.01)
  *G11C 11/4096*  (2006.01)
(58) Field of Classification Search
  USPC .......................................................... 365/149
  See application file for complete search history.

(56)  References Cited

U.S. PATENT DOCUMENTS

| | | |
|---|---|---|
| 9,953,702 B2 | 4/2018 | Son |
| 11,106,535 B2 | 8/2021 | Cho et al. |
| 11,380,368 B2 | 7/2022 | Ji et al. |
| 2003/0031069 A1 | 2/2003 | Sakemi |
| 2019/0229753 A1 | 7/2019 | Cha |
| 2021/0407576 A1 | 12/2021 | Shang et al. |
| 2022/0083418 A1 | 3/2022 | Ji et al. |

FOREIGN PATENT DOCUMENTS

| | | | | |
|---|---|---|---|---|
| CN | 106251892 A | | 12/2016 | |
| CN | 107767919 A | | 3/2018 | |
| CN | 112435696 A | | 3/2021 | |
| CN | 213183603 U | | 5/2021 | |
| CN | 113140252 A | | 7/2021 | |
| CN | 113470711 A | | 10/2021 | |
| JP | 11195766 A | * | 7/1999 | ............... G11C 5/14 |
| JP | 2002025299 A | * | 1/2002 | ........... G06F 11/1008 |

OTHER PUBLICATIONS

International Search Report cited in PCT/CN2022/099559 mailed Sep. 21, 2022, 9 pages.

* cited by examiner

MEMORY BANK AND MEMORY

CROSS-REFERENCE TO RELATED APPLICATIONS

This is a continuation of International Application No. PCT/CN2022/109220, filed on Jul. 29, 2022, which claims the priority to Chinese Patent Application No. 202111590252.0, titled "MEMORY BANK AND MEMORY" and filed on Dec. 23, 2021. The entire contents of International Application No. PCT/CN2022/109220 and Chinese Patent Application No. 202111590252.0 are incorporated herein by reference.

TECHNICAL FIELD

The present disclosure relates to, but is not limited to, a memory bank and a memory.

BACKGROUND

As a semiconductor memory commonly used in a computer, a dynamic random access memory (DRAM) includes many repeated memory cells. Each memory cell usually includes a capacitor and a transistor. The transistor is provided with a gate connected to a word line, a drain connected to a bit line, and a source connected to the capacitor. A voltage signal on the word line can be configured to control on or off of the transistor, and then data information stored in the capacitor is read through the bit line, or the data information is written into the capacitor through the bit line for storage.

The DRAM may be classified into a double data rate (DDR) DRAM, a graphics double data rate (GDDR) DRAM, and a low power double data rate (LPDDR) DRAM. As the DRAM is applied to more and more fields, for example, the DRAM is increasingly used in the mobile field, users have increasingly higher requirements on the power consumption of the DRAM.

However, the power consumption of the existing DRAM is still high, and cannot meet low power consumption requirements.

SUMMARY

An overview of the subject described in detail in the present disclosure is provided below. This overview is not intended to limit the protection scope of the claims.

The present disclosure provides a memory bank and a memory.

A first aspect of the present disclosure provides a memory bank, including:
  multiple memory arrays arranged along a first direction, each of the memory arrays being divided into at least two array units along a second direction, and the first direction and the second direction being perpendicular to each other;
  read-write control circuits, the read-write control circuits being provided between adjacent two of the memory arrays; and
  data signal lines, configured to electrically connect the read-write control circuits and the array units;
  wherein, different array units of each of the memory arrays are electrically connected to different read-write control circuits through different data signal lines.

A second aspect of the present disclosure provides a memory, including the memory bank according to the first aspect.

Other aspects of the present disclosure are understandable upon reading and understanding of the accompanying drawings and detailed description.

BRIEF DESCRIPTION OF THE DRAWINGS

The accompanying drawings incorporated into the specification and constituting a part of the specification illustrate the embodiments of the present disclosure, and are used together with the description to explain the principles of the embodiments of the present disclosure. In these accompanying drawings, similar reference numerals represent similar elements. The accompanying drawings in the following description illustrate some rather than all of the embodiments of the present disclosure. Those skilled in the art may obtain other accompanying drawings based on these accompanying drawings without creative efforts.

DETAILED DESCRIPTION

The technical solutions in the embodiments of the present disclosure are described below clearly and completely with reference to the accompanying drawings in the embodiments of the present disclosure. Apparently, the described embodiments are merely some rather than all of the embodiments of the present disclosure. All other embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

It can be known from the background that the power consumption of the current DRAM needs to be further reduced.

Figure 1:
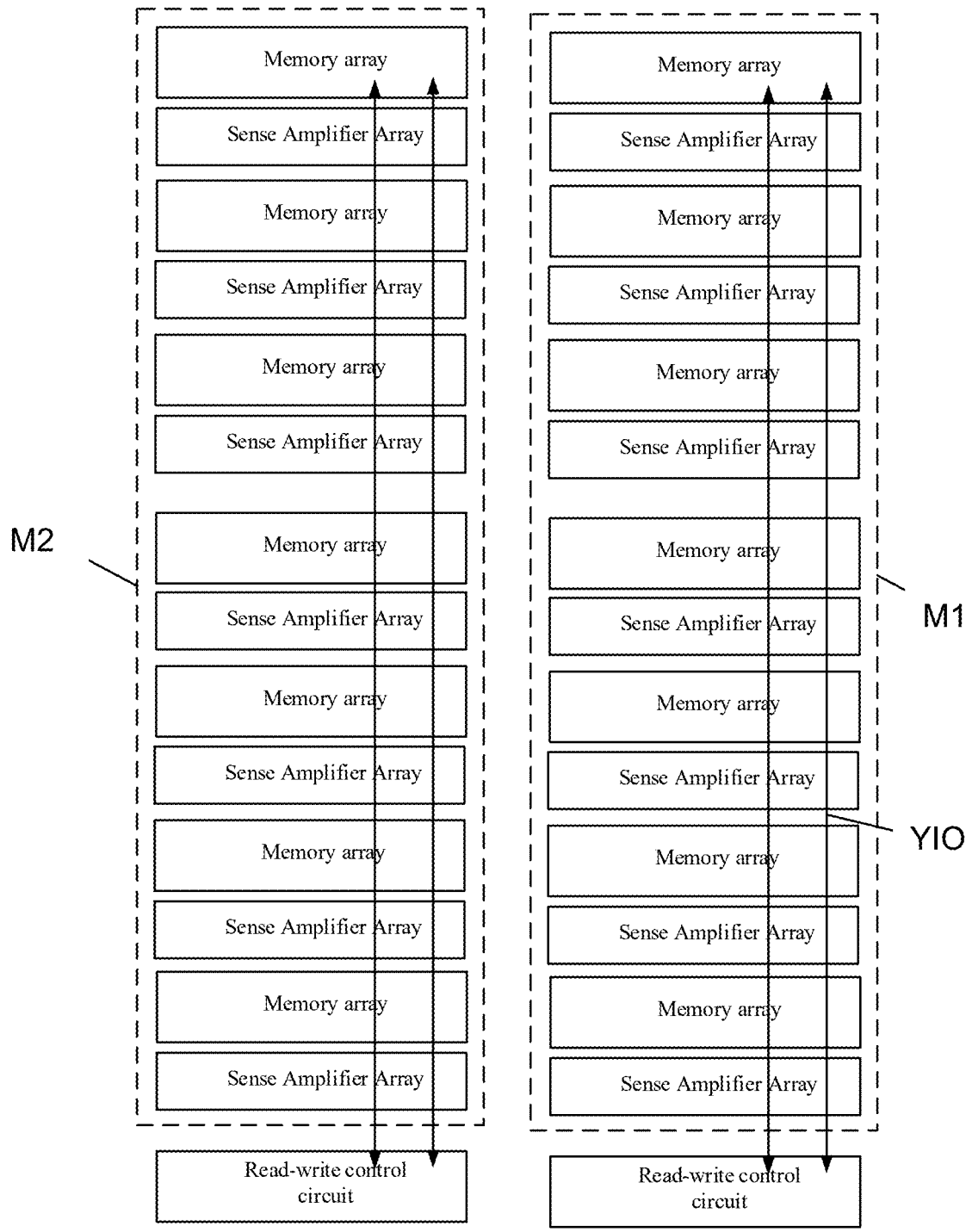
FIG. 1 is a schematic structural diagram of a DARM.

Now a schematic structural diagram of a DRAM is combined for analysis. FIG. 1 is a schematic structural diagram of a DARM. Referring to FIG. 1, the DRAM includes a plurality of memory banks (also called banks), each of the memory banks includes multiple memory arrays, and each of the memory arrays includes a memory array and a sense amplifier array. For the DRAM, whether it is DDR (2/3/4, etc.) series or LPDDR (2/3/4/5) series, the memory banks are divided into a high-order group and a low-order group according to output pins (DQ). That is to say, each memory bank may also be correspondingly divided into two half memory banks. One half memory bank serves as a first module M1 for providing a low-order output pin, and the other half memory bank serves as a second module M2 for providing a high-order output pin.

The data signal lines YIO are configured to transmit the data between the selected memory array and read-write control circuit. Whether it is a low-level group of half memory banks or a high-level group of half memory banks, to successfully complete read and write operations, the data signal lines YIO and all the memory arrays in the half memory banks have electrical contacts, resulting in the parasitic capacitance. The data signal lines YIO are very long, resulting in a large parasitic resistance, which will bring about the problem of large power consumption per read and write, resulting in high power consumption of the DRAM.

After further analysis, it is found that the parasitic resistance and the parasitic capacitance are also one of the main reasons for the large power consumption of the DARM. For the data signal lines YIO, during each read operation or write operation, there are parasitic capacitances and parasitic resistances at the electrical contacts between each group of data signal lines YIO and each of the memory arrays. Due to the large number of electrical contacts, the corresponding parasitic resistance and parasitic resistance are large, resulting in large power consumption of the DRAM.

The embodiments of the present disclosure provide a memory bank having excellent structural performance. Through the design of a special structure, the parasitic resistance and parasitic capacitance of the memory bank are reduced, thereby reducing the power consumption of the memory bank.

Figure 2:
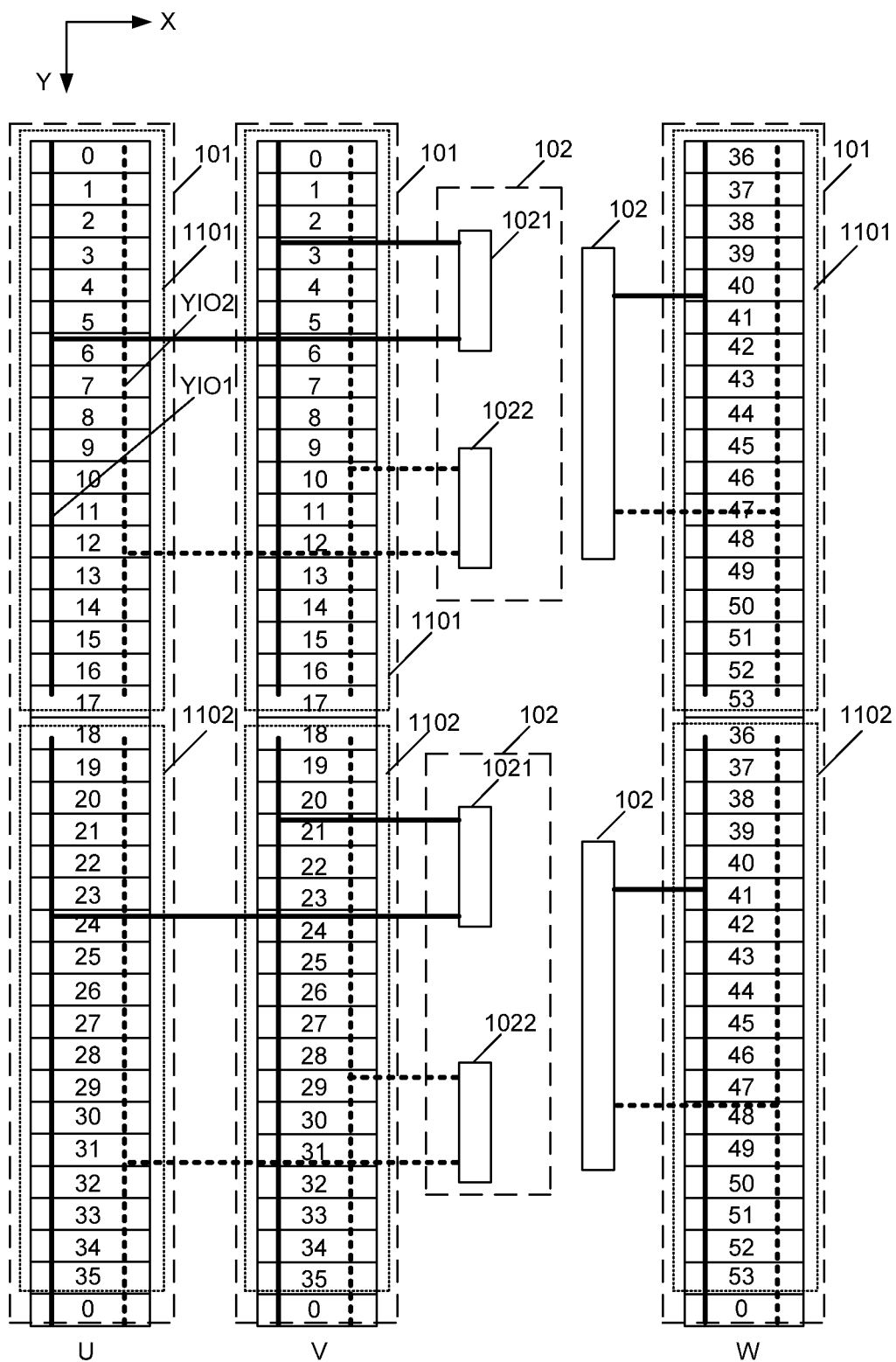
FIG. 2 is a schematic structural diagram of a memory bank according to one embodiment of the present disclosure.

FIG. 2 is a schematic structural diagram of a memory bank according to one embodiment of the present disclosure.

Referring to FIG. 2, in this embodiment, the memory bank includes: multiple memory arrays 101 arranged along a first direction (X), each of the memory arrays 101 being divided into at least two array units (such as an array unit 1101 and an array unit 1102) along a second direction (Y), and the first direction X and the second direction Y being perpendicular to each other; (multiple) read-write control circuits, the read-write control circuits being provided between adjacent two of the memory arrays 101 (such as a memory array V and a memory array W in FIG. 2; for convenience of illustration, U, V, and W in the figure respectively represent a memory array U, a memory array V, and the memory array W); and (multiple) data signal lines (such as YIO1 and YIO2) configured to electrically connect the read-write control circuits and the array units; where, different array units of each of the memory arrays 101 are electrically connected to different read-write control circuits through different data signal lines YIO. It can be known that the first direction X is a direction in which the word line WL extends, and the second direction Y is a direction in which the bit line BL extends.

The memory bank having excellent structural performance provided in the embodiments of the present disclosure includes the memory arrays divided into at least two array units, the read-write control circuits, and the data signal lines configured to electrically connect the read-write control circuits and the array units. In a single read operation, each of the read-write control circuits only needs to access one array unit in the corresponding memory array, and the read-write control circuit and each of the array units in the memory arrays are connected through different data signal lines. Each of the data signal lines is electrically connected to only one of the array units, i.e., having an electrical contact. Therefore, the electrical contacts in a single read-write operation are reduced, and a parasitic resistance and a parasitic capacitance of the memory bank are also reduced, thereby facilitating reducing the power consumption of the memory bank. Moreover, since the read-write control circuits are provided between adjacent two of the memory arrays, a distance from one of the read-write control circuits to the corresponding array unit may be greatly shortened, thereby reducing the length of each of the data signal lines, and improving the efficiency of data transmission.

The embodiments of the present disclosure are described in detail below with reference to the drawings. It should be noted that, for the convenience of description, the following embodiments are described by taking an example where the memory bank includes three memory arrays 101 and four read-write control circuits. It can be known that, in the embodiments of the present disclosure, the number of the memory arrays 101 and the number of the read-write control circuits may also be other numbers, which may be set according to actual requirements. Moreover, for the convenience of illustration, thick solid line symbols and thick dashed line symbols marked in FIG. 2 and FIG. 5 all represent electrical connections, i.e., having electrical contacts. Thick solid lines differ from thick dashed lines only in that the ordering positions of the connected memory arrays are different. The thick solid lines are connected to the odd-ordered memory arrays, and thick dashed lines are connected to even-ordered memory arrays.

As shown in FIG. 2, in this embodiment, the memory bank may include: three memory arrays U, V, and W, each of the memory arrays 101 being divided into at least two array units (such as an array unit 1101 and an array unit 1102) along the second direction Y; four read-write control circuits, the read-write control circuits being provided between adjacent two of the memory arrays 101. Each of the read-write control circuits may be electrically connected to one or more array units in the three memory arrays 101, but it needs to satisfy that different array units of each of the memory arrays 101 are electrically connected to different read-write control circuits through different data signal lines YIO.

For example, four read-write control circuits are located between the memory array V and the memory array W, and each of the two read-write control circuits close to the memory array V is connected to one array unit in the memory array U and one array unit in the memory array V. One read-write control circuit 102 is connected to the array units in the memory array V and the memory array U, and the read-write control circuit 102 is connected to the odd-ordered memory arrays in the two array units through the data signal lines YIO1 and the even-ordered memory arrays in the two array units through the data signal lines YIO2. Similarly, the other read-write control circuit 102 is connected to the two array units in the memory array V and the memory array U, and the read-write control circuit 102 is connected to the odd-ordered memory arrays in the two array units through the data signal lines YIO1 and the even-ordered memory arrays in the two array units through the data signal lines YIO2. Each of the two read-write control circuits close to the memory array W is connected to one array unit in the memory array W One read-write control circuit 102 is connected to the array unit 1101 in the memory array W, and the read-write control circuit 102 is simultaneously connected to the odd-ordered memory arrays and the even-ordered memory arrays in the array unit 1101 through the data signal lines YIO1 and the data signal lines YIO2. Similarly, the other read-write control circuit 102 is connected to the array unit 1102 in the memory array W, and the read-write control circuit 102 is simultaneously connected to the odd-ordered memory arrays and the even-ordered memory arrays in the array unit 1102 through the data signal lines YIO1 and the data signal lines YIO2.

In actual wiring design, it is possible to design the connection between the array unit and the read-write control circuit 102 in a short distance, to reduce the wiring cost. It should be noted that one array unit is not only connected to one YIO, and the data signal lines YIO1 and the data signal lines YIO2 only generally refer to one of the data signal lines connected to one memory array in the array units.

Each memory array 101 includes the memory arrays (numbered 0, 1, 2, . . . as shown in FIG. 2) and the sense amplifier (SA) array (not shown in FIG. 2, please referring to FIG. 1). Each of the memory arrays includes a plurality of memory cells for storing the data. The sense amplifier array is configured to amplify output signals of the memory arrays. The number of the memory arrays and the number of the sense amplifier array included in each of the array units may be the same or different.

Compared with the solution in which all the memory arrays in one of the memory arrays 101 are electrically connected to the data signal lines and are electrically connected to the read-write control circuits through the data signal lines, in this embodiment, during a single read operation or write operation, the data signal lines are connected to only one of array units in the memory arrays 101. That is, the data signal lines are electrically connected to only some of the array units, to reduce the electrical contacts. In this way, parasitic circuits and parasitic capacitors in the memory bank can be reduced, and loads hanging on the data signal lines are significantly reduced. Therefore, the power consumption of the memory bank can be significantly reduced.

In addition, since different data signal lines are configured to connect different array units, the lengths of the data signal lines may be reduced. For example, in FIG. 2, in the two array units of each of the memory arrays 101, the array unit 1101 and the array unit 1102 use two sections of data signal lines that are disconnected from each other (each of the data signal lines YIO1 and the data signal lines YIO2 is also divided into two sections). That is, the data signal lines on one sides of the array units in the memory arrays are electrically connected to only the array units, and do not need to extend to one sides of the array units 1102. Similarly, the data signal lines on one sides of the array units 1102 in the memory arrays are electrically connected to only the array units 1102, and do not need to extend to one sides of the array units, thereby reducing the lengths of the data signal lines, facilitating further reducing the resistance of the data signal lines and the power consumption, and further reducing the power consumption of the memory bank.

In conclusion, the memory bank provided in this embodiment consumes little power each time, and accordingly, the memory bank has the advantage of low power consumption.

In the related art, for the DRAM, data errors often occur in the process of data storage, so an ECC technology is required to ensure the correctness of data storage. The related art usually checks and corrects erroneous data by adding check bits to valid data bits of a certain length. There are still deficiencies in the ECC technology of the related art.

Figure 3:
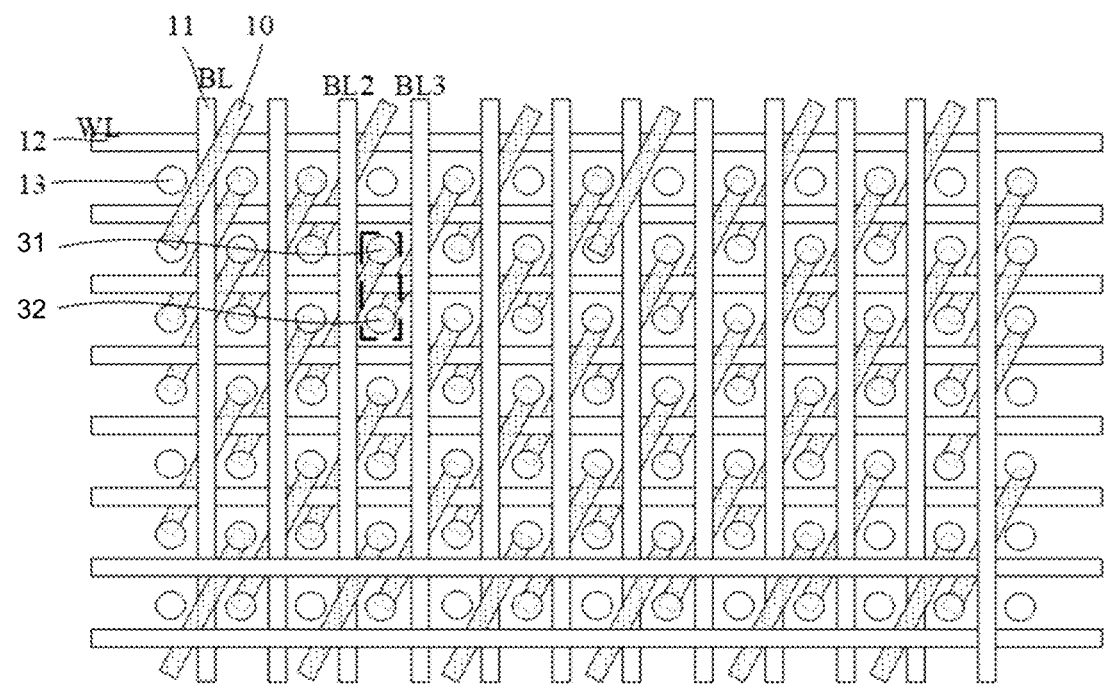
FIG. 3 is a top schematic structural diagram of a layout of a memory.

After analysis, it is found that if there is a one-bit error in the data, the ECC verification technology can not only find but also correct it. The ECC verification may also find 2-4 bit errors. However, the ECC verification is difficult to correct errors of 2 or more bits. That is to say, although the ECC verification technology may check and correct a single-bit error at the same time, if there are errors in two or more bits of data checked at the same time, the current ECC verification technology cannot do anything. In addition, after further analysis, it is found that there is a high probability that two data currently at adjacent positions have errors at the same time. After further analysis, it is found that the main reasons for this problem are analyzed as follows:

FIG. 3 is a top schematic structural diagram of a layout of a memory. The memory includes: a plurality of active regions 10 arranged in an array; word lines 12, bit lines 11, and capacitors 13 electrically connected to the active regions. There is a defect of cell-to-cell bridge in the memory, or called adjacent two-bit error. For example, a bridge occurs between a capacitor 31 and a capacitor 32 corresponding to the adjacent active regions 10, etc., as shown in the dashed box in FIG. 3, the capacitor 31 is connected to a bit line BL2 through a transistor, and the capacitor 32 is connected to a bit line BL3 through a transistor. As the process size of the memory is getting smaller, the probability of such a defect is also increasing.

Figure 4:
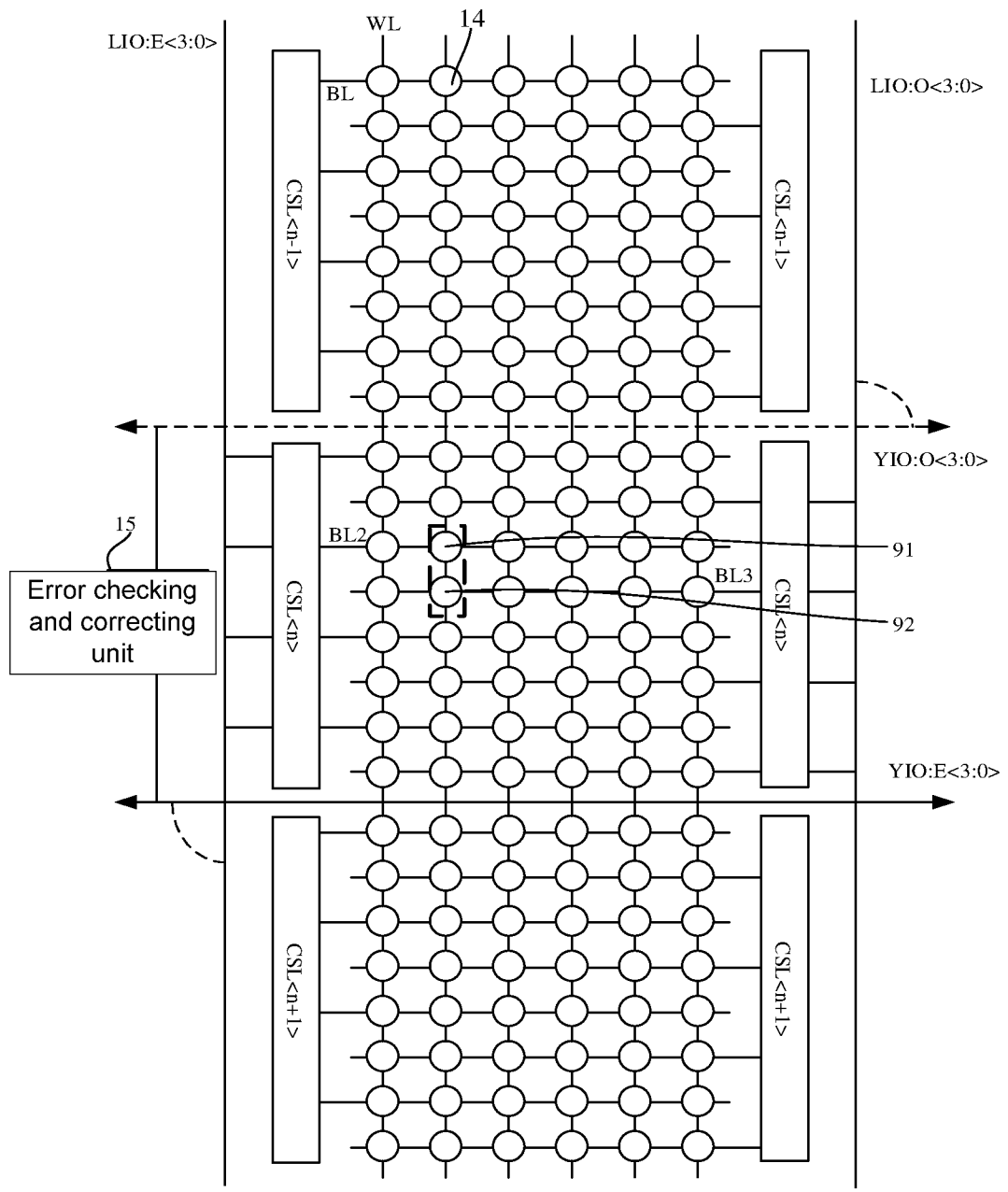
FIG. 4 is a schematic structural diagram of a memory.

FIG. 4 is a schematic structural diagram of a memory. The memory includes: memory arrays including memory cells 14, each of the memory cells 14 being connected to bit lines BL and word lines WL; column selection signal units marked as CSL<n−1>, CSL<n>, and CSL<n+1> in FIG. 4, each of the column selection signal units including a plurality of column selection signal lines, each of the column selection signal lines being connected to local data buses through the corresponding bit lines BL in switch control memory arrays, switch control signals being from column decoding circuits (not shown in FIG. 4) for determining whether data on the bit lines BL is transmitted to the local data buses, for example, the column selection signal unit CSL<n> including eight column selection signal lines, and the eight column selection signal lines being connected to the local data buses through the bit lines BL in the switch control memory arrays; the local data buses marked as LIO in FIG. 4, where odd-numbered local data buses are marked as LIO: O<3:0>, and even-numbered local data buses are marked as LIO: E<3:0>; block data buses marked as YIO in FIG. 4, where odd-numbered block data buses are marked as YIO: O<3:0>, and even-numbered block data buses are marked as YIO: E<3:0>. The local data buses are connected to the block data buses through local conversion circuits (such as local sense amplification circuits, not shown in FIG. 4). FIG. 4 shows the interaction between YIO:E<3:0> and LIO:E<3:0>, and the interaction between YIO:O<3:0> and LIO:O<3:0> with arc curves.

With reference to FIG. 3 and FIG. 4, the block data buses YIO:E<3:0> and YIO:O<3:0> are connected to a same ECC unit 15. If two bit lines BL corresponding to two memory cells 14 are just connected to a same column decoding circuit, two errors occur simultaneously at a same readout time point. For example, in FIG. 4, the memory cell 91 and the memory cell 92 (in FIGS. 3, 31 and 32 represent the capacitors, while in FIGS. 4, 91 and 92 represent the memory cells; the memory cells usually include capacitors and transistors) are erroneous at the same time, and the corresponding bit lines BL2 and BL3 both transmit their data to the local data lines LIO:O<3:0> and the local data lines LIO:E<3:0> through the column selection signal unit CSL<n>, the data is then transmitted to YIO:E<3:0> and YIO:O<3:0> through the local conversion circuits, then there are two-bit errors entering the ECC unit 15 at the same time. The ECC currently used cannot correct the above two-bit errors (for example, for ECC of 128 bits (data bits)+8 bits (check bits), correction of only one bit can be completed).

Another embodiment of the present disclosure also provides a memory bank. The memory bank is substantially the same as the memory bank provided in the previous embodiment, and the difference is: multiple memory arrays 101 configured to store data and check codes. The memory bank further includes: multiple ECC units provided between adjacent two of the memory arrays 101, electrically connected to the multiple read-write control circuits, and configured to perform error checking and/or error correction on the data according to the check codes. In the read operation, the data and the check codes read by the read-write control circuits are divided into at least two parts, and the read-write control circuits are configured to transmit each part to different ECC units. Since the read-write control circuits divide the output data of the array units into at least two parts in each read operation, and the read-write control circuits transmit each part to different ECC units, when more than one errors occur simultaneously in the output data of the array units, different errors can be corrected by different ECC units, such that the memory bank can correct the more than one errors, thereby improving the ECC capability of the memory bank. The memory bank provided in this embodiment is described below with reference to the accompanying drawings. It should be noted that, for the parts the same as or corresponding to those mentioned in the previous embodiment, reference may be made to the detailed descriptions of the previous embodiment. Details are not repeated below.

Figure 5:
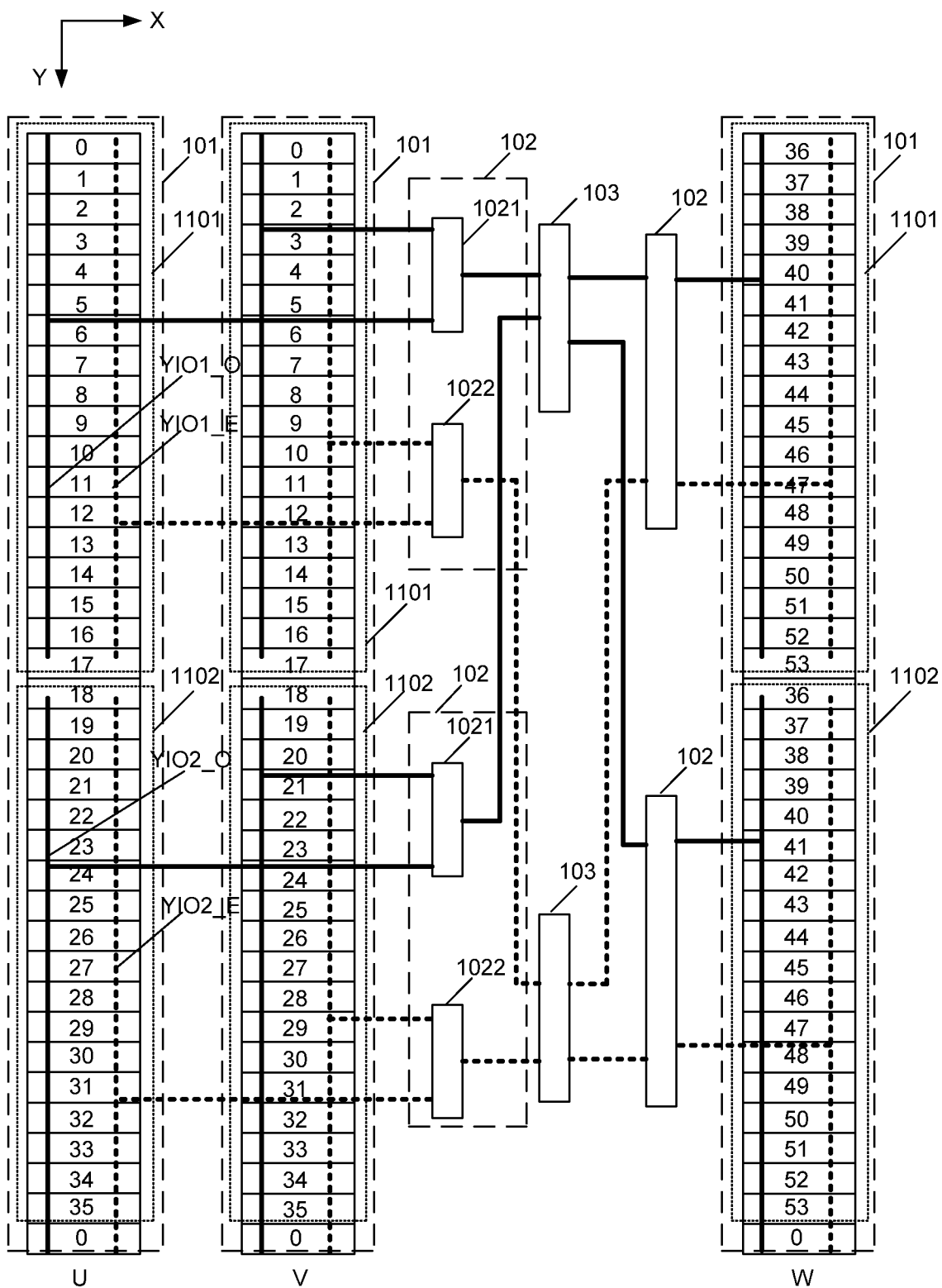
FIG. 5 is a schematic structural diagram of a memory bank according to another embodiment of the present disclosure.

As shown in FIG. 5, the number of multiple ECC units 103 in the memory bank may be two, and the ECC units 103 are arranged close to the read-write control circuits and electrically connected to the above four read-write control circuits respectively for performing error checking and/or error correction on the read data according to the check codes read from the array units each time. In the read operation, the data and the check codes read from the array units by the read-write control circuits are divided into at least two parts (for example, randomly allocated, or allocated according to the serial number parity of the memory arrays where the data is located), and the read-write control circuits are configured to transmit one part to one ECC unit and transmit the remaining part to the other ECC unit.

For example, in FIG. 5, each of the read-write control circuits divides all the check codes and data read from the array units into two parts, and in the two parts, one part is transmitted to the ECC unit 103 close to the array unit 1101 by the read-write control circuits, and the remaining part is transmitted to the ECC unit 1032 close to the array unit 1102 by the read-write control circuits.

Since the read-write control circuits divide the output data of the array units into at least two parts in each read operation, and the read-write control circuits transmit each part to different ECC units, when more than one errors occur simultaneously in the output data of the array units, different errors can be corrected by different ECC units, such that the memory bank can correct the more than one errors, thereby improving the ECC capability of the memory bank, and improving the read-write capability of the memory.

In this embodiment, the memory bank further includes: a row decoding circuit (not shown in the figure) configured to emit a row decoding signal to position and select word lines in the different array units.

For example, when the row decoding signal is configured to position and select the array units in the memory array U and the memory array V, the data in the corresponding array units is read through the data signal lines YIO1 or YIO2 located on one sides of the array units in the memory array U and the memory array V.

Figure 6:
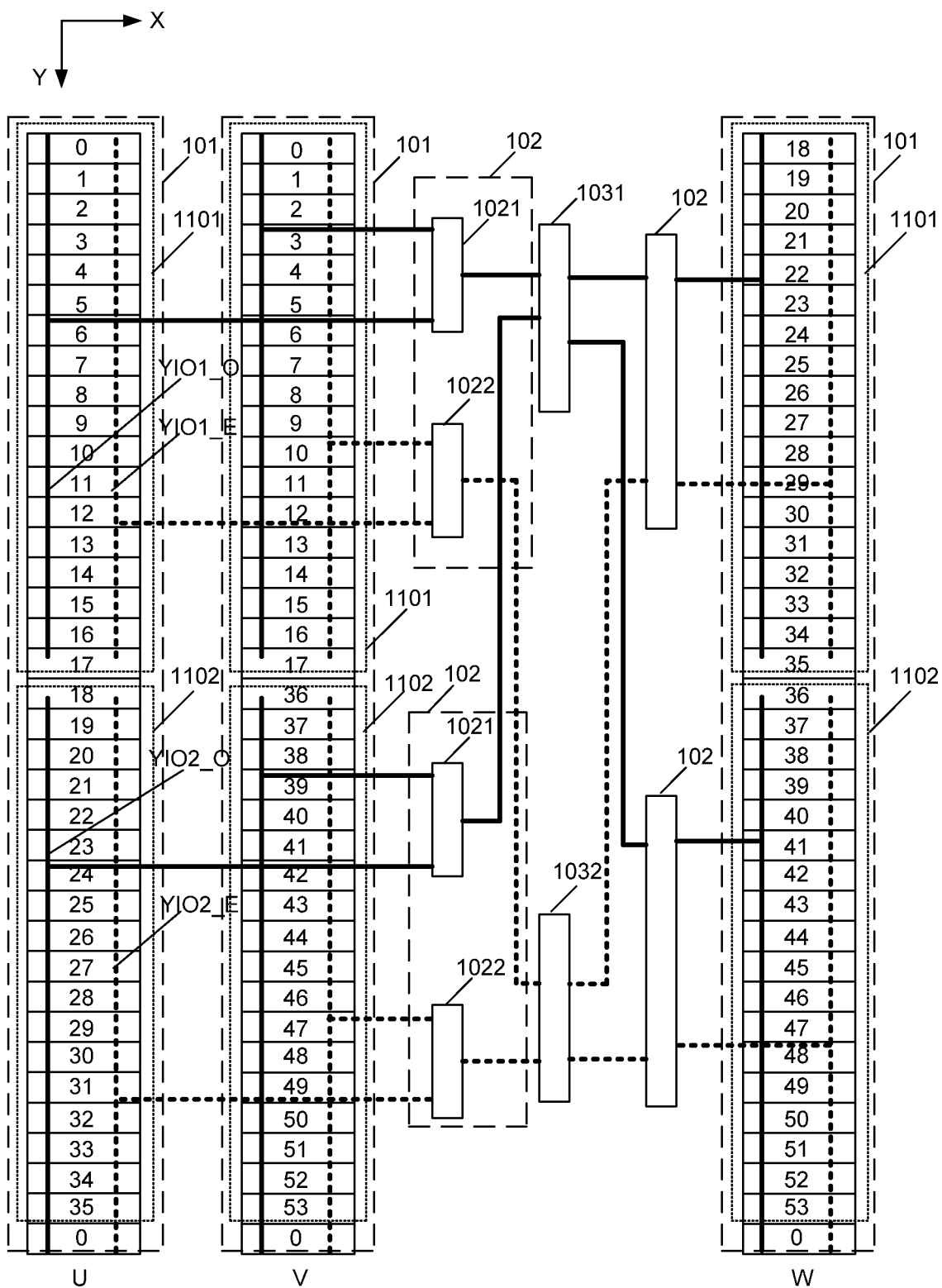
FIG. 6 is a schematic structural diagram of a memory bank according to another embodiment of the present disclosure.

FIG. 6 shows a memory bank according to another embodiment of the present disclosure. On the basis of any of the previous memory bank structures, the number of multiple ECC units 103 is two, which may be:

a first ECC unit 1031 connected to each of the array units through the read-write control circuits and configured to perform error checking and error correction on part of output data of the array units; and a second ECC unit 1032 connected to each of the array units through the read-write control circuits and configured to perform error checking and error correction on remaining part of the output data of the array units.

In this embodiment, for the arrangement of the memory arrays, please refer to FIG. 3 and FIG. 4. In this embodiment, taking an example where the output data of the memory array U is 136 bits, of which the data of 128 bits is valid data (the memory requires data to interact with an external controller through a memory interface), and the data of 8 bits is the check codes generated after being processed by the first ECC unit 1031 and the second ECC unit 1032. It should be noted that the memory includes a data write operation and a data read operation. When the data write operation is performed on the memory arrays in the memory, the data received through the memory interface is processed by an ECC module (such as the first ECC unit 1031 and the second ECC unit 1032 in FIG. 6). For example, the data of 128 bits enters the ECC module, and is also called the valid data. The data outputted by the ECC module is 136 bits (the valid data of 128 bits+the check codes of 8 bits), of which the data of 128 bits is the valid data, and 8 bits are the check codes generated by the ECC module. The 136 bits are all stored into the memory array U of the memory. It may be called an encoding process when the ECC module is for the data write operation. When the data read operation is performed from the memory arrays in the memory, the data of 136 bits (the valid data of 128 bits+the check codes of 8 bits) is also outputted from the memory array U, these 136 bits enter the ECC module at the same time, and the ECC module performs an algorithm opposite to write at this time. It may be called a decoding process when the ECC module is for the data read operation. The ECC module performs a decoding operation on the valid data of 128 bits, and compares a result of the decoding operation with the check codes of 8 bits to determine whether the outputted valid data of 128 bits has errors. If there is only one-bit error in every 64 bits, the ECC module may also correct the one-bit error.

Still referring to FIG. 6, in this embodiment, for example, taking an example where the data of 272 bits (the stored data of 256 bits+the check codes of 16 bits) is read from the memory array U and the memory array V, the output data of 136 bits (the stored data of 128 bits+the check codes of 8 bits) read from the memory array U is outputted to the first ECC unit 1031 and the second ECC unit 1032 respectively, and the output data of 136 bits (the stored data of 128 bits+the check codes of 8 bits) read from the memory array V is outputted to the first ECC unit 1031 and the second ECC unit 1032 respectively. A comparative embodiment is provided, the memory array U outputs the output data of 136 bits (the stored data of 128 bits+the check codes of 8 bits) to the first ECC unit 1031, and the memory array V outputs the output data of 136 bits (the stored data of 128 bits and the check codes of 8 bits) to the second ECC unit 1032. Comparatively, since part of the output data of the memory array U (or the memory array V) is inputted into the first ECC unit 1031 for error checking and error correction, and the remaining part of the output data is inputted into the second ECC unit 1032 for error checking and error correction, when more than one errors (such as two-bit errors) occur in the output data of the memory array U (or the memory array V) at the same time, different errors can be corrected by the first ECC unit 1031 or the second ECC unit 1032, such that the memory can correct the more than one errors, thereby improving the ECC capability of the memory.

In this embodiment, the number of bits of the data received by the first ECC unit 1031 is the same as the number of bits of the data received by the second ECC unit 1032. In one example, the number of bits of the data received by the first ECC unit 1031 and the number of bits of the data received by the second ECC unit 1032 are both 128 bits+8 bits, of which 128 bits are the valid data written into or read from the memory array U and the memory array V, and 8 bits are the check codes generated by the first ECC unit 1031 or the second ECC unit 1032.

In addition, an internal error checking algorithm of the first ECC unit 1031 is the same as that of the second ECC unit 1032, thereby facilitating reducing the design difficulty of the memory.

Taking the first ECC unit 1031 as an example, each time the data is written, the first ECC unit 1031 uses the internal error checking algorithm to calculate the valid data (128 bits) and calculates check bits (8 bits) recorded as first check bits, and then the valid data (128 bits) and the check bits (8 bits) are written into the memory array 101 at the same time. When these data are read out from the memory arrays 101, the same algorithm is configured to calculate the valid data (128 bits) again to obtain check bit (8 bits) recorded as second check bits, and the second check bits are compared with the directly read first check bits, if results are the same, the data is correct, or otherwise, there is an error, and the first ECC unit 1031 may logically check the error. When only the one-bit error occurs, the first ECC unit 1031 may correct the error without affecting the read operation of the memory. For example, when "0" in the third bit of 128 bits is an erroneous bit, the first ECC unit 1031 corrects the "0" in the third bit to "1".

For the working principle of the second ECC unit 1032, reference may be made to the first ECC unit 1031, which will not be repeated below.

Part of the output data of the memory array U is inputted into the first ECC unit 1031 for error checking and error correction, and the remaining part of the output data is inputted into the second ECC unit 1032 for error checking and error correction. In this way, two adjacent bit errors that may occur in the same memory array U are respectively placed in different ECC units, since the two pieces of erroneous data are respectively processed by the first ECC unit 1031 and the second ECC unit 1032, that is, the first ECC unit 1031 and the second ECC unit 1032 only process one error, the memory can correct the two errors at the same time from the perspective of the memory.

Regarding an ECC mechanism when an error occurs in the memory array V and the memory array W, reference may be made to the corresponding description of the memory array U, which will not be repeated herein.

In this embodiment, the memory arrays U and V have the same storage capacity as the memory array W. In other embodiments, the storage capacities of the memory arrays U, V, and W may not be exactly the same.

Figure 7:
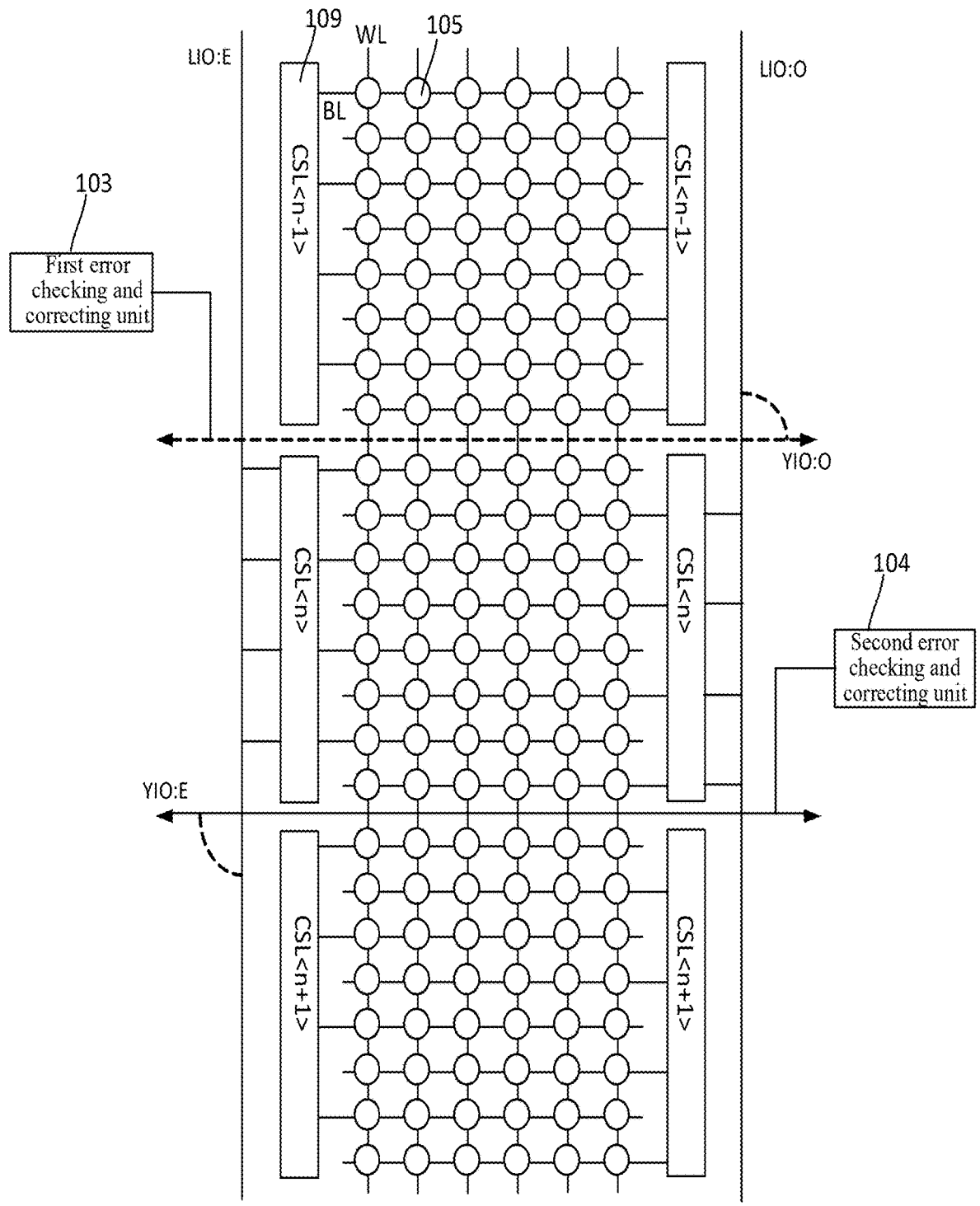
FIG. 7 is a schematic diagram of signal line connection in a local region of a memory in FIG. 6.

With reference to FIG. 6 and FIG. 7, FIG. 7 is a schematic diagram of signal line connection in a local region repeated by thick lines in a pane of memory arrays 101 in FIG. 6 (it is indicated by unfolding the memory array U, the thick solid lines are only connected to the odd-numbered squares, the thick dashed lines are only connected to the even-numbered squares, and the memory arrays V and W are the same as the memory array U). The local data buses LIO are connected to a plurality of sense amplifiers (not shown) through the column selection signal units 109, and the sense amplifiers are arranged in one-to-one correspondence with the bit lines BL of the memory cells 105. The column selection signal units 109 include gating switches, and the on or off of the gating switches is controlled through the column selection signals. When the gating switches are turned on, the sense amplifiers exchange the data with the local data buses LIO. When the gating switches are turned off, the sense amplifiers and the local data buses LIO no longer exchange the data. In addition, the output data on the adjacent bit lines BL enters the local data bus O and the local data bus E respectively through the sense amplifier and the column selection signal unit 109. For the convenience of distinction, in FIG. 7, LIO:E shows the local data bus E, LIO:O shows the local data bus O, CSL<n−1>, CSL<n>, and CSL<n+1> show the column selection signal units, the gating switches are located in the column selection signal units (not shown), and the sense amplifiers are located on both sides of the bit lines BL (not shown). The local data bus E also exchanges the data with the block data bus E through the local conversion circuit (not shown), and the local data bus O also exchanges the data with the block data bus O through the local conversion circuit (not shown). In FIG. 7, the solid line YIO:E with arrows shows the block data bus E, the dashed line YIO:O with arrows shows the block data bus O.

Still referring to FIG. 6, YIO1_O shows one of the block data buses O, and YIO1_E shows one of the block data buses E. In one embodiment, YIO:E in FIG. 7 may be understood as one YIO1_E, and YIO:O in FIG. 7 may be understood as one YIO1_O. YIO1_O passes through block amplifiers (not shown) and the read-write control circuits to the first ECC unit 1031, and YIO1_E passes through the block amplifiers (not shown) and the read-write control circuits to the second ECC unit 1032. Similarly, YIO2_O shows one of the block data buses O, and YIO2_E shows one of the block data buses E. In one embodiment, YIO:E in FIG. 7 may be understood as one YIO2_E, and YIO:O in FIG. 7 may be understood as one YIO2_O. YIO2_O passes through block amplifiers (not shown) and the read-write control circuits to the first ECC unit 1031, and YIO2_E passes through the block amplifiers (not shown) and the read-write control circuits to the second ECC unit 1032.

Still referring to FIG. 6, the data of YIO_O enters the first ECC unit 1031, and the data of YIO_E enters the second ECC unit 1032. In this embodiment, the memory arrays U, V, and W each include a local conversion circuit (Local SA, not shown) and even number of local data buses. The local data buses are divided into a local data bus O and a local data bus E, the local data bus O is connected to the block data bus O through the local conversion circuit, and the local data bus E is connected to the block data bus E through the local conversion circuit.

It should be noted that, the local data buses are sequentially numbered according to natural numbers from zero, an odd-numbered local data bus is defined as the local data bus O, and an even-numbered local data bus is defined as the local data bus E. Or, among the local data buses corresponding to the memory arrays that are physically adjacent, the local data bus at the odd-numbered position is defined as the local data bus O, and the local data bus at the even-numbered position is defined as the local data bus E.

The data that are physically adjacent are placed in different ECC units, i.e., entering the first ECC unit 1031 and the second ECC unit 1032 respectively, when two-bit adjacent errors occur, since the two-bit errors are corrected in the different ECC units respectively, the two-bit errors can be processed at the same time. It can be understood that even if the process size keeps shrinking, the risk of bridging between the adjacent capacitors increases. However, since the data corresponding to the adjacent capacitors enter different ECC units for error correction, even if the process size keeps shrinking, it can still ensure that the errors of the physically adjacent two bits of data can be corrected.

Still referring to FIG. 6, the arrangement of the memory arrays in the memory array U is numbered from zero according to natural numbers, and the block data buses are electrically connected to the even-numbered memory arrays. For example, each of the memory arrays includes the memory cells, the local data bus E, the local data bus O, and the local conversion circuit. The block data buses are connected to the local data bus E through the local conversion circuit; and the block data buses are connected to the local data bus O through the local conversion circuit. In FIG. 6, the connecting relationship between the block data bus and the memory array is marked with a thick line symbol. For the description of the connecting relationship between the block data buses of the memory arrays V and W, reference may be made to the corresponding description of the memory array U, which will not be repeated below.

It can be understood that, in one example, there are 2*4*(16*N) block data buses, there are 2*4*M*(16*N) local data buses; there are 4*(16*N) block data buses O, there are 4*(16*N) block data buses E; there are 4*M*(16*N) local data buses O, there are 4*M*(16*N) local data buses E; if one block data bus O corresponds to M local data buses O, one block data bus E corresponds to M local data buses E; and the local data buses are divided into M*(16*N) groups of the local data buses O and M*(16*N) groups of the local data buses E by taking adjacent four of the local data buses as a group. M and N are natural numbers greater than or equal to 1. Taking an example where M and N are both 1, there are 2*4*16 block data buses, there are 2*4*16 local data buses; there are 4*16 block data buses O, there are 4*16 block data buses E; there are 4*16 local data buses O, there are 4*16 local data buses E; and there are 16 groups of local data buses 0 in total and 16 groups of local data buses E in total.

In one example, as shown in FIG. 6, the data signal line corresponding to each of the array units includes even number of block data buses, and the block data buses are sequentially numbered from zero according to natural numbers.

The odd-numbered block data buses O (marked as YIO_O, such as YIO1_O or YIO2_O) are connected to the first ECC unit 1031 through the read-write control circuits, and the even-numbered block data buses E (marked as YIO_E, such as YIO1_E or YIO2_E) are connected to the second ECC unit 1032 through the read-write control circuits. Each of the memory units in the memory array U includes even number of block data buses, and the block data buses are sequentially numbered from zero according to natural numbers. The odd-numbered block data buses O (marked as YIO_O) are connected to the first ECC unit 1031 through the read-write control circuits, and the even-numbered block data buses E (marked as YIO_E) are connected to the second ECC unit 1032 through the read-write control circuits. Each of the memory units in the memory array V includes even number of block data buses, and the block data buses are sequentially numbered from zero according to natural numbers. The odd-numbered block data buses O (marked as YIO_O) are connected to the first ECC unit 1031 through the read-write control circuits, and the even-numbered block data buses E (marked as YIO_E) are connected to the second ECC unit 1032 through the read-write control circuits. Each of the memory units in the memory array W includes even number of block data buses, and the block data buses are sequentially numbered from zero according to natural numbers. The odd-numbered block data buses O (marked as YIO_O) are connected to the first ECC unit 1031 through the read-write control circuits, and the even-numbered block data buses E (marked as YIO_E) are connected to the second ECC unit 1032 through the read-write control circuits.

In this way, the data in the block data buses O (YIO_O) of the memory arrays U, V, and W enters the first ECC unit 1031 through the read-write control circuits for error checking and error correction; and the data in the block data buses E (YIO_E) of the memory arrays U, V, and W enters the second ECC unit 1032 through the read-write control circuits for error checking and error correction.

In another example, the data signal lines corresponding to each of the array units include even number of block data buses, the block data buses are sequentially numbered according to natural numbers from zero, the odd-numbered block data buses O (marked as YIO_O) are connected to the second ECC unit 1032, and the even-numbered block data buses E (marked as YIO_E) are connected to the first ECC unit 1031. Each of the array units in the memory array U includes even number of block data buses, the block data buses are sequentially numbered from zero according to natural numbers. The odd-numbered block data buses O (marked as YIO_O) are connected to the second ECC unit 1032, and the even-numbered block data buses E (marked as YIO_E) are connected to the first ECC unit 1031. Each of the memory units in the memory array V includes even number of block data buses, and the block data buses are sequentially numbered from zero according to natural numbers. The odd-numbered block data buses O (marked as YIO_O) are connected to the second ECC unit 1032, and the even-numbered block data buses E (marked as YIO_E) are connected to the first ECC unit 1031. Each of the memory units in the memory array W includes even number of block data buses, and the block data buses are sequentially numbered from zero according to natural numbers. The odd-numbered block data buses O (marked as YIO_O) are connected to the second ECC unit 1032, and the even-numbered block data buses E (marked as YIO_E) are connected to the first ECC unit 1031.

In this way, the data in the block data buses O (YIO_O) of the memory arrays U, V, and W enters the second ECC unit 1032 for error checking and error correction; and the data in the block data buses E (YIO_E) of the memory arrays U, V, and W enters the first ECC unit 1031 for error checking and error correction.

In the memory bank provided in this embodiment, the output data of a same array unit is inputted into different ECC units. That is, part of the output data is inputted into the first ECC unit 1031 for error checking and error correction, and the remaining part of the output data is inputted into the second ECC unit 1032 for error checking and error correction. In this way, if there is an error in two bits of data at the same time, the first ECC unit 1031 and the second ECC unit 1032 can respectively correct one bit of data in the two bits, thereby improving the ECC capability of the memory.

Still referring to FIG. 6, in these embodiments, there are a plurality of read-write control circuits divided into first type read-write control circuits and second type read-write control circuits.

Each of the first type read-write control circuits corresponds to two array units, and the first type read-write control circuit 102 includes: a first read-write control unit 1021 and a second read-write control unit 1022; the first read-write control unit 1021 is connected between the odd-numbered block data buses O of the corresponding array units and the first ECC unit 1031, and the second read-write control unit 1022 is connected between the even-numbered block data buses E of the corresponding array units and the second ECC unit 1032.

Each of the second type read-write control circuits corresponds to one array unit, and the second type read-write control circuit 102 is entirely connected between all the block data buses of the corresponding array unit and the first ECC unit 1031 and the second ECC unit 1032.

Referring to FIG. 6, in this embodiment, in addition to the reserved part of the read-write control circuits to receive the data transmitted by the odd-numbered block data buses O and the even-numbered block data buses E of the array units as a whole (two read-write control circuits close to the array unit W in FIG. 6), one read-write control circuit 102 is also designed and split into two read-write control units. One read-write control unit 1021 is responsible for exclusively receiving the data transmitted by the odd-numbered block data buses O of the array units, and the other read-write control unit 1022 is responsible for exclusively receiving the data transmitted by the even-numbered block data buses E of the same array unit.

By specially setting two read-write control units for respectively receiving the data transmitted by the odd-numbered block data buses O and the even-numbered block data buses E of the array units, the differentiated management of the data can be improved, and the design cost can be saved.

Figure 8:
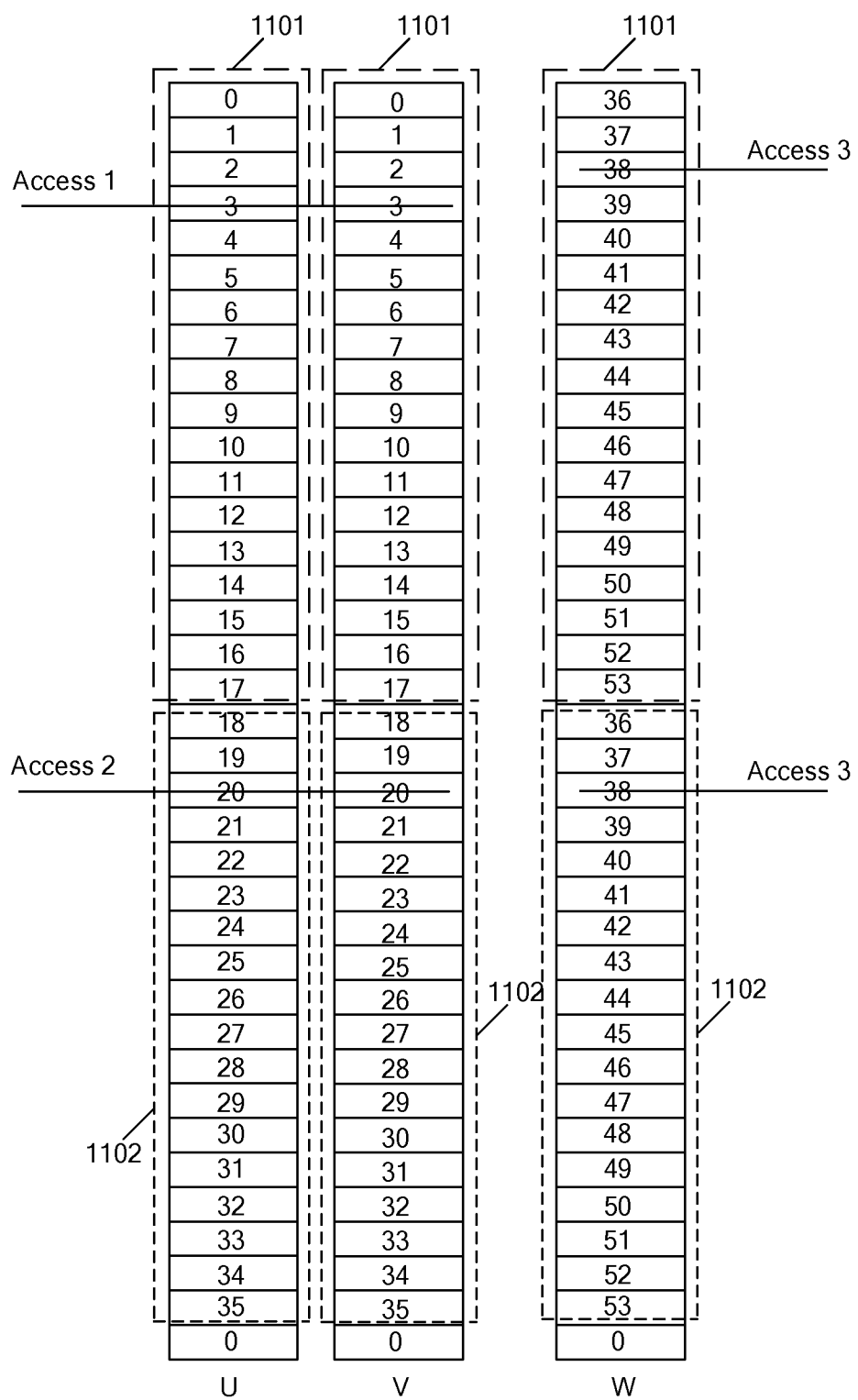
FIG. 8 is a schematic structural diagram of a memory bank according to another embodiment of the present disclosure.

FIG. 8 is a schematic structural diagram of a memory bank according to another embodiment of the present disclosure.

In some embodiments of the present disclosure, the output data of two array units in the memory array U, the memory array V, and the memory array W corresponds to high-order data and low-order data respectively. For example, in the memory array U, the array units store the high-order data, and the array units 1102 store the low-order data; in the memory array V, the array units on the sides with a smaller order number of the memory arrays store the lower-order data, and the array units 1102 store the high-order data; and in the memory array W, the array units store the high-order data, and the array units 1102 store the low-order data. In this way, since the data outputted by the two array units in the memory array U, the memory array V, and the memory array W includes the low-order data and the high-order data, a single access will only access one array unit storing the high-order data in the memory array U, the memory array V, or the memory array W and the other array unit storing the low-order data in a different memory array 101, thereby reducing the power consumption of the memory.

Referring to FIG. 8, the above multiple memory arrays 101 (for other structures except the memory arrays 101, reference may be made to the description in the previous embodiment, and details are not described herein) include the memory array U, the memory array V, and the memory array W sequentially arranged along the first direction. Each of the memory arrays is divided into two array units along the second direction. The two array units that are respectively in the memory array U and the memory array V and located on a same side in the second direction share the same word line address. The read-write control circuit corresponding to the memory array U and the memory array V is correspondingly configured to simultaneously access the memory cells having the same word line address in the two array units that are respectively in the memory array U and the memory array V and on the same side.

For example, two array units that are respectively in the memory array U and the memory array V and located on a first side may share the same word line address. The read-write control circuit corresponding to the memory array U and the memory array V is correspondingly configured to simultaneously access the memory cells having the same word line addresses in the two array units that are respectively in the memory array U and the memory array V and on the first side. Or, two array units that are respectively in the memory array U and the memory array V and located on a second side share the same word line address, and the first side and the second side are two opposite sides in the second direction. The read-write control circuit corresponding to the memory array U and the memory array V is correspondingly configured to simultaneously access the memory cells having the same word line addresses in the two array units that are respectively in the memory array U and the memory array V and on the second side.

For example, referring to FIG. 8, taking an example where the side where the array units in the memory array U and the memory array V are located is set as the first side, the side where the array units 1102 are located is set as the second side, and the two array units that are respectively in the memory array U and the memory array V and located on the first side share the same word line address, the two array units that are respectively in the memory array U and the memory array V may share the same word line address, that is, the memory arrays having the same word line address may be accessed through a same word line. For example, the data in the memory arrays numbered 3 in the memory array U and the memory array V may be accessed at the same time through a word line address corresponding to an access 1.

Stilling referring to FIG. 8, when the two array units that are respectively in the memory array U and the memory array V and located on the first side share the same word line address, the two array units that are respectively in the memory array U and the memory array V and located on the second side share the same word line address. The read-write control circuit 102 corresponding to the memory array U and the memory array V is correspondingly configured to simultaneously access the two array units that are respectively in the memory array U and the memory array V and on the second side. When the two array units that are respectively in the memory array U and the memory array V and located on the second side share the same word line address, the two array units that are respectively in the memory array U and the memory array V and located on the first side share the same word line address. The read-write control circuit 102 corresponding to the memory array U and the memory array V is correspondingly configured to simultaneously access the two array units that are respectively in the memory array U and the memory array V and on the first side.

Referring to FIG. 8, taking an example where the side where the array units in the memory array U and the memory array V are located is set as the first side, the side where the array units 1102 are located is set as the second side, and the two array units that are respectively in the memory array U and the memory array V and located on the first side share the same word line address, when the two array units that are respectively in the memory array U and the memory array V share the same word line address, the two array units that are respectively in the memory array U and the memory array V may also share the same word line address, that is, the memory arrays having the same word line address may be accessed through a same word line. For example, the data in the memory arrays numbered 20 in the memory array U and the memory array V may be accessed at the same time through a word line address corresponding to an access 2.

Still referring to FIG. 8, when the two array units that are respectively in the memory array U and the memory array V and located on the first side share the same word line address and/or the two array units that are respectively in the memory array U and the memory array V and located on the second side share the same word line address, two array units located on the first side and the second side in the memory array W share a same word line address. The read-write control circuits corresponding to the memory array W are correspondingly configured to simultaneously access the array units on the first side and the second side in the memory array W.

Referring to FIG. 8, taking an example where the side where the array units in the memory array U and the memory array V are located is set as the first side, the side where the array units 1102 are located is set as the second side, and the two array units that are respectively in the memory array U and the memory array V and located on the first side share the same word line address, the two array units (the array unit 1101 and the array unit 1102) in the memory array W may also share the same word line address, that is, the memory arrays having the same word line address may be accessed through a same word line. For example, the data in the memory arrays numbered 38 in the array unit 1101 and the array unit 1102 of the memory array W may be accessed at the same time through a word line address corresponding to an access 3.

Compared with the previous embodiment, the memory bank provided in this embodiment can simultaneously access the data in the two array units according to the same word line address by configuring the access state of the read-write control circuit corresponding to each memory array, thereby achieving flexible access data combinations.

On the basis of the memory bank in the previous embodiments, this embodiment also provides a memory. The memory includes the memory bank in any one or at least two of the previous embodiments in combination.

The embodiments or implementations of this specification are described in a progressive manner, and each embodiment focuses on differences from other embodiments. The same or similar parts between the embodiments may refer to each other.

In the description of this specification, the description with reference to terms such as "an embodiment", "an exemplary embodiment", "some implementations", "a schematic implementation", and "an example" means that the specific feature, structure, material, or characteristic described in combination with the implementation(s) or example(s) is included in at least one implementation or example of the present disclosure.

In this specification, the schematic expression of the above terms does not necessarily refer to the same implementation or example. Moreover, the described specific feature, structure, material or characteristic may be combined in an appropriate manner in any one or more implementations or examples.

It should be noted that in the description of the present disclosure, the terms such as "center", "top", "bottom", "left", "right", "vertical", "horizontal", "inner" and "outer" indicate the orientation or position relationships based on the accompanying drawings. These terms are merely intended to facilitate description of the present disclosure and simplify the description, rather than to indicate or imply that the mentioned apparatus or element must have a specific orientation and must be constructed and operated in a specific orientation. Therefore, these terms should not be construed as a limitation to the present disclosure.

It can be understood that the terms such as "first" and "second" used in the present disclosure can be used to describe various structures, but these structures are not limited by these terms. Instead, these terms are merely intended to distinguish one structure from another.

The same elements in one or more accompanying drawings are denoted by similar reference numerals. For the sake of clarity, various parts in the accompanying drawings are not drawn to scale. In addition, some well-known parts may not be shown. For the sake of brevity, a structure obtained by implementing a plurality of steps may be shown in one figure. In order to understand the present disclosure more clearly, many specific details of the present disclosure, such as the structure, material, size, processing process, and technology of the device, are described below. However, as those skilled in the art can understand, the present disclosure may not be implemented according to these specific details.

Finally, it should be noted that the above embodiments are merely intended to explain the technical solutions of the present disclosure, rather than to limit the present disclosure. Although the present disclosure is described in detail with reference to the above embodiments, those skilled in the art should understand that they may still modify the technical solutions described in the above embodiments, or make equivalent substitutions of some or all of the technical features recorded therein, without deviating the essence of the corresponding technical solutions from the scope of the technical solutions of the embodiments of the present disclosure.

INDUSTRIAL APPLICABILITY

The memory bank and the memory provided in the embodiments of the present disclosure include the memory arrays divided into at least two array units, the read-write control circuits, and the data signal lines configured to electrically connect the read-write control circuits and the array units. In a single read operation, each of the read-write control circuits only needs to access one array unit in the corresponding memory array, and the read-write control circuit and each of the array units in the memory arrays are connected through different data signal lines. Each of the data signal lines is electrically connected to only one of the array units, i.e., having an electrical contact. Therefore, the electrical contacts in a single read-write operation are reduced, and a parasitic resistance and a parasitic capacitance of the memory bank are also reduced, thereby facilitating reducing the power consumption of the memory bank. Moreover, since the read-write control circuits are provided between adjacent two of the memory arrays, a distance from one of the read-write control circuits to the corresponding array unit may be greatly shortened, thereby reducing the length of each of the data signal lines, and improving the efficiency of data transmission. In addition, the memory arrays are configured to store the data and the check codes. The memory bank further includes the ECC units configured to perform error checking and/or error correction on the data according to the check codes. Since the ECC unit is provided between adjacent two of the memory arrays where one read-write control circuit is located, the layout between the read-write control circuit and the ECC unit may be compact, thereby reducing the layout area. Moreover, a distance from the read-write control circuit to the ECC unit can also be shortened, thereby reducing the length of the data signal line between the two, and improving the efficiency of data transmission. In addition, the output data on adjacent two of the bit lines enters the local data bus O and the local data bus E respectively through the sense amplifier and the gating switch, such that the data corresponding to the physically adjacent local data buses separately enters the first ECC unit and the second ECC unit. Therefore, when the data corresponding to the bit lines located at adjacent positions is wrong at the same time, the errors can also be corrected, thereby further improving the ECC capability of the memory. In addition, the multiple memory arrays include the memory array U, the memory array V, and the memory array W, and each of the memory arrays is divided into two array units. The two array units that are respectively in the memory array U and the memory array V and located on at least one same side share the same word line address, and the read-write control circuit corresponding to the memory array U and the memory array V is correspondingly configured to simultaneously access the two array units that are respectively in the memory array U and the memory array V and on the same side, such that the two memory arrays may be simultaneously accessed through the shared word line address, thereby reducing the word line overheads, and reducing the energy consumption.

The invention claimed is:

1. A memory bank, comprising:
   multiple memory arrays arranged along a first direction, each of the memory arrays being divided into at least two array units along a second direction, and the first direction and the second direction being perpendicular to each other;
   a plurality of read-write control circuits, the plurality of read-write control circuits being provided between adjacent two of the memory arrays; and
   a plurality of data signal lines, configured to electrically connect the plurality of read-write control circuits and all of the array units;
   wherein, different array units of the at least two array units of each of the memory arrays are electrically connected to a different one of the plurality of read-write control circuits through a different one of the plurality of data signal lines;
   wherein the multiple memory arrays are configured to store data and check codes; and the memory bank further comprises:
   multiple error checking and correcting units, provided between the adjacent two of the memory arrays, electrically connected to the plurality of read-write control circuits, and configured to perform at least one of an error checking or an error correction on the data according to the check codes;
   wherein the multiple error checking and correcting units at least comprise:
   a first error checking and correcting unit, connected to each of the array units through the plurality of read-write control circuits, and configured to perform the error checking and the error correction on a part of output data of the array units; and
   a second error checking and correcting unit, connected to each of the array units through the plurality of read-write control circuits, and configured to perform the error checking and the error correction on a remaining part of the output data of the array units;
   wherein data signal lines corresponding to each of the array units comprise an even number of block data buses, the block data buses are sequentially numbered according to natural numbers from zero, odd-numbered block data buses O are connected to the first error checking and correcting unit, and even-numbered block data buses E are connected to the second error checking and correcting unit.

2. The memory bank according to claim 1, wherein each of the array units comprises a local conversion circuit and an even number of local data buses, the local data buses are divided into local data buses O and local data buses E, the local data buses O are connected to the block data buses O through the local conversion circuit, and the local data buses E are connected to the block data buses E through the local conversion circuit.

3. The memory bank according to claim 2, wherein each of the local data buses is connected to a plurality of sense amplifiers through gating switches, and the sense amplifiers are arranged in one-to-one correspondence with bit lines in the memory array.

4. The memory bank according to claim 3, wherein output data on adjacent two of the bit lines enters the local data buses O and the local data buses E respectively through the sense amplifiers and the gating switches.

5. The memory bank according to claim 4, wherein there are $2*4*(16*N)$ block data buses, there are $2*4*M*(16*N)$ local data buses; there are $4*(16*N)$ block data buses O, there are $4*(16*N)$ block data buses E; there are $4*M*(16*N)$ local data buses O, there are $4*M*(16*N)$ local data buses E; one of the block data buses O corresponds to M of the local data buses O, one of the block data buses E corresponds to M of the local data buses E; and the local data buses are divided into $M*(16*N)$ groups of the local data buses O and $M*(16*N)$ groups of the local data buses E by taking adjacent four of the local data buses as a group.

6. The memory bank according to claim 1, wherein the plurality of read-write control circuits are divided into first type read-write control circuits and second type read-write control circuits;
   each of the first type read-write control circuits corresponds to two array units, and the first type read-write control circuit includes a first read-write control unit and a second read-write control unit; the first read-write control unit is connected between the odd-numbered block data buses O of corresponding array units and the first error checking and correcting unit, and the second read-write control unit is connected between the even-numbered block data buses E of the corresponding array units and the second error checking and correcting unit; and
   each of the second type read-write control circuits corresponds to one array unit, and the second type read-write control circuit is entirely connected between all the block data buses of a corresponding array unit and the first error checking and correcting unit and the second error checking and correcting unit.

7. A memory bank, comprising:
   multiple memory arrays arranged along a first direction, each of the memory arrays being divided into at least two array units along a second direction, and the first direction and the second direction being perpendicular to each other;
a plurality of read-write control circuits, the plurality of read-write control circuits being provided between adjacent two of the memory arrays; and
a plurality of data signal lines, configured to electrically connect the plurality of read-write control circuits and all of the array units;
wherein, different array units of the at least two array units of each of the memory arrays are electrically connected to a different one of the plurality of read-write control circuits through a different one of the plurality of data signal lines;
wherein the multiple memory arrays comprise a memory array U, a memory array V, and a memory array W sequentially arranged along the first direction; each of the memory arrays is divided into two array units along the second direction; two array units that are respectively in the memory array U and the memory array V and located on a same side in the second direction share a same word line address; and
a read-write control circuit corresponding to the memory array U and the memory array V is correspondingly configured to simultaneously access memory cells having a same word line address in the two array units that are respectively in the memory array U and the memory array V and on the same side.

8. The memory bank according to claim 7, wherein two array units that are respectively in the memory array U and the memory array V and located on a first side share a same word line address; a read-write control circuit corresponding to the memory array U and the memory array V is correspondingly configured to simultaneously access memory cells having a same word line address in the two array units that are respectively in the memory array U and the memory array V and on the first side; or, two array units that are respectively in the memory array U and the memory array V and located on a second side share a same word line address, and the first side and the second side are two opposite sides in the second direction; and a read-write control circuit corresponding to the memory array U and the memory array V is correspondingly configured to simultaneously access memory cells having a same word line address in the two array units that are respectively in the memory array U and the memory array V and on the second side.

9. The memory bank according to claim 8, when the two array units that are respectively in the memory array U and the memory array V and located on the first side share the same word line address, the two array units that are respectively in the memory array U and the memory array V and located on the second side share the same word line address;
the read-write control circuit corresponding to the memory array U and the memory array V is correspondingly configured to simultaneously access the two array units that are respectively in the memory array U and the memory array V and on the second side;
when the two array units that are respectively in the memory array U and the memory array V and located on the second side share the same word line address, the two array units that are respectively in the memory array U and the memory array V and located on the first side share the same word line address; and
the read-write control circuit corresponding to the memory array U and the memory array V is correspondingly configured to simultaneously access the two array units that are respectively in the memory array U and the memory array V and on the first side.

10. The memory bank according to claim 9, when at least one of the two array units that are respectively in the memory array U and the memory array V and located on the first side share the same word line address or the two array units that are respectively in the memory array U and the memory array V and located on the second side share the same word line address, two array units located on the first side and the second side in the memory array W share a same word line address; and
read-write control circuits corresponding to the memory array W are correspondingly configured to simultaneously access the array units on the first side and the second side in the memory array W.

11. The memory bank according to claim 1, further comprising: a row decoding circuit, configured to emit a row decoding signal, to position and select word lines in different array units in the at least two array units of each of the memory arrays.

12. A memory, comprising the memory bank according to claim 1.

* * * * *